(12) United States Patent
You et al.

(10) Patent No.: US 6,272,036 B1
(45) Date of Patent: Aug. 7, 2001

(54) CONTROL OF MAGNETIC DIRECTION IN MULTI-LAYER FERROMAGNETIC DEVICES BY BIAS VOLTAGE

(75) Inventors: Chun-Yeol You, Hinsdale; Samuel D. Bader, Oak Park, both of IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 09/467,808

(22) Filed: Dec. 20, 1999

(51) Int. Cl.$^7$ .................................................. G11C 17/02
(52) U.S. Cl. .............................. 365/97; 365/171; 365/173
(58) Field of Search .............................. 365/97, 158, 171, 365/173; 360/119, 126, 324.2

(56) References Cited

U.S. PATENT DOCUMENTS

| | | | |
|---|---|---|---|
| 5,636,093 | * | 6/1997 | Gijs et al. .............................. 360/126 |
| 5,691,865 | * | 11/1997 | Johnson et al. .................... 360/324.2 |
| 5,695,864 | * | 12/1997 | Slonczewski .......................... 428/212 |
| 5,986,858 | * | 11/1999 | Sato et al. .......................... 360/324.2 |
| 6,069,820 | * | 5/2000 | Inomata et al. ....................... 365/171 |

\* cited by examiner

*Primary Examiner*—David Nelms
*Assistant Examiner*—Gene N. Auduong
(74) *Attorney, Agent, or Firm*—Michael D. Rechtin; Foley & Lardner (57) ABSTRACT

A system for controlling the direction of magnetization of materials comprising a ferromagnetic device with first and second ferromagnetic layers. The ferromagnetic layers are disposed such that they combine to form an interlayer with exchange coupling. An insulating layer and a spacer layer are located between the first and second ferromagnetic layers. A direct bias voltage is applied to the interlayer exchange coupling, causing the direction of magnetization of the second ferromagnetic layer to change. This change of magnetization direction occurs in the absence of any applied external magnetic field.

27 Claims, 10 Drawing Sheets

CONTROL OF MAGNETIC DIRECTION IN MULTI-LAYER FERROMAGNETIC DEVICES BY BIAS VOLTAGE

This invention was made with government support under Contract No. W-31-109-ENG-38 awarded to the Department of Energy. The Government has certain rights in this invention.

BACKGROUND OF THE INVENTION

This invention relates generally to the control of the magnetization direction in multi-layer ferromagnetic devices by the use of a bias voltage. More particularly, this invention relates to the control of the direction of magnetization in multi-layer devices having a ferromagnetic/spacer/insulator/ferromagnetic configuration.

It is often desirable to control the direction of magnetization in multi-layer devices. A common type of such a device comprises two ferromagnetic electrodes that are separated by a thin layer of insulation. The standard practice for altering the magnetization direction is to apply an external magnetic field to the device. Typically this is accomplished by running a current through a conducting wire. The two ferromagnetic electrodes are configured to have different responses to magnetic fields such that the relative orientations are altered when in the presence of an external magnetic field.

Although such systems are reasonably useful, they have several significant limitations. For example, it is extremely difficult, if not impossible, to localize an external magnetic field to a high degree. By not being able to localize the magnetic field, the overall efficiency and usefulness of the magnetic devices is hindered when used in applications such as magnetic sensors, digital read heads and nonvolatile memory devices. In particular, novel magneto-electronic devices such as GMR (giant magnetoresistance) and TMR (tunneling magnetoresistance) systems which consist of F1/S/F2 and F1/I/F2 structures (F1, F2: ferromagnets, S: spacer, I: insulator layer) are actively being studied by many researchers for the applications of magnetic sensors, digital read heads, and nonvolatile memory. Most of these structures are fabricated to respond to external magnetic fields. If the magnetization direction could be controlled by an applied voltage which can be easily localized, numerous new applications and devices could be developed.

There have been attempts to create different types of ferromagnetic devices with improved qualities but these have their drawbacks. For example, U.S. Pat. No. 5,764,567 issued to Parkin, discloses a four-layer structure wherein the two outer layers are comprised of ferromagnetic materials. Between the two outer layers are an insulating layer and a spacer layer. This four-layer structure forms a magnetic tunnel junction, creating a quantum-mechanical tunneling of the charge that is present between the ferromagnetic electrodes. One of the ferromagnetic layers is fixed in a preferred position, while the other ferromagnetic layer is free to rotate its magnetization direction. When an external magnetic field is applied to the structure, a magnetoresistance response if formed. Unfortunately, however, this device still relies upon the presence of an external magnetic field to operate successfully. Although the '567 reference describes the use of an additional current that is applied to the system, this voltage is intended to be extremely small (applying a voltage of <0.1 volts) and is used primarily to aid in the study of the resulting current.

SUMMARY OF THE INVENTION

It is therefore an object of the invention to provide an improved system for controlling the magnetization direction of a ferromagnetic/spacer/insulator/ferromagnetic system through the use of a bias voltage.

It is a further object of this invention to provide a novel system for controlling the magnetization direction of a ferromagnetic device wherein the energy input can be applied to a small surface area.

It is yet another object of this invention to provide an improved system for controlling the magnetization direction of a ferromagnetic device wherein the use of the system permits smaller structures to be used with improved sensitivity.

It is yet another object to this invention to provide a novel system for controlling the magnetization direction of included ferromagnetic layers without requiring that one of the ferromagnetic layers have fixed its direction and magnetization.

It is still another object to this invention to provide an improved system for controlling the magnetization direction of the included ferromagnetic layers that can be used in developing increased resolution for flat panel displays.

It is still another object to this invention to provide a novel system for controlling the magnetization direction of ferromagnetic layers that can be used as a magnetic field sensor for digital read heads, computer hard drives, and magnetic random access memories and magnetic logic circuits for central processor units.

These and other objects, advantages and features of the invention together with the organization and manner of operation thereof will become apparent from the following detailed description when taken into conjunction with the accompanying drawings wherein like elements have like numerals throughout the drawings described below.

DETAILED DESCRIPTION OF THE PREFERRED EMBODIMENTS

In order to illustrate embodiments of the invention, an explanation is provided to describe the methodology and function first for a prior art interlayer exchange coupling methodology and then the interlayer exchange coupling concept of the present invention. Although the manner in which the phenomena is described is one rigorous approach which explains the operation of the invention for those skilled in the art, other conventional mathematical and theoretical explanations can also be used to describe similar results which characterize embodiments of the invention. The invention is therefore not limited to the description of its operation by the following mathematical explanations.

A controllable exchange coupling device with a simple one-dimensional free-electron-like model is used herein to describe operation of the invention with the focus being primarily on substantive physical characteristics, rather than on rigorous mathematics. It is useful initially to review the well-known interlayer exchange coupling in typical $F_1/S/F_2$ systems. It is known that the interlayer exchange coupling through the spacer layer oscillates with the thickness of the spacer layer, and depends on the detailed topology of the Fermi surface of the spacer layer. According to this conventional viewpoint, the oscillatory exchange coupling can be interpreted as the energy difference of quantum well states between ferromagnetic and antiferromagnetic configurations of the two ferromagnetic layers $F_1$ and $F_2$. Where the energy due to the quantum interference in the ferromagnetic configuration is $E_{FM}$, and the antiferromagnetic configuration is $E_{AFM}$ at temperature T=0, the exchange coupling energy per unit area is given as follows:

$$J = \frac{E_{FM} - E_{AFM}}{A} \approx \frac{1}{4\pi^3} \text{Im} \quad (1)$$

$$\int d^2 k_\| \int_{-\infty}^{E_F} \ln\left(\frac{(1 - r_1^\uparrow r_2^\uparrow \exp(2ik_\perp D))(1 - r_1^\downarrow r_2^\downarrow \exp(2ik_\perp D))}{(1 - r_1^\uparrow r_2^\downarrow \exp(2ik_\perp D))(1 - r_1^\downarrow r_2^\uparrow \exp(2ik_\perp D))}\right) dE$$

and for small confinement, this expression reduces to $$J \approx -\frac{1}{\pi^3} \text{Im} \int d^2 k_\| \int_{-\infty}^{E_F} \Delta R_1 \Delta R_2 \exp(2ik_\perp D + i\varphi_1 + i\varphi_2) dE. \quad (2)$$

Figure 2A:
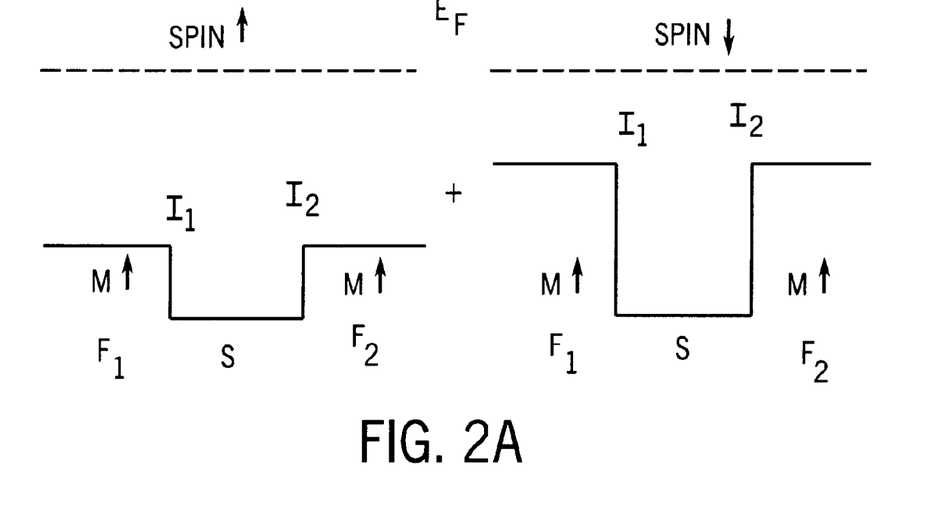
FIG. 2A is a representation of a one-dimensional quantum well model for a $F_1/S/F_2$ system for a ferromagnetic configuration and FIG. 2B is for an antiferromagnetic configuration.
Figure 2B:
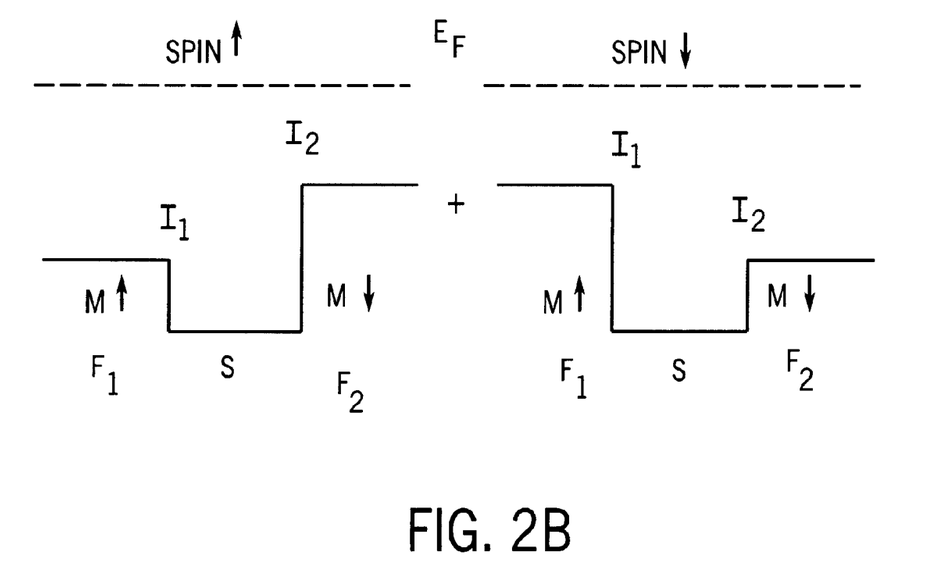

Here, $$\Delta R_{1,2} \exp(i\varphi_{1,2}) = \left.\frac{r_\uparrow - r_\downarrow}{2}\right|_{1,2},$$

and $r_{\uparrow,\downarrow}$ are reflectivities of spin up (↑), or down (↓) the electrons at interfaces 1 and 2, represented as $I_1$ and $I_2$ as shown in FIGS. 2A and 2B. D is the thickness of the spacer layer, A is the area of the interface $k_\|$ and $k_\perp$ are k-vectors parallel and perpendicular to the interfaces, respectively. Here it is assumed that the two ferromagnetic layers are made of the same materials for simplicity. Even though more exact expressions for the exchange coupling energy are known, only the above equations are considered in this instance for the sake of simplicity and physical insight. As can be seen from Eq. (2), the exchange coupling energy oscillates with the thickness of the spacer layer via the Fermi wave vector $k_\perp$; the $1/D^2$ dependence of the coupling strength arises from the energy integration.

Figure 3A:
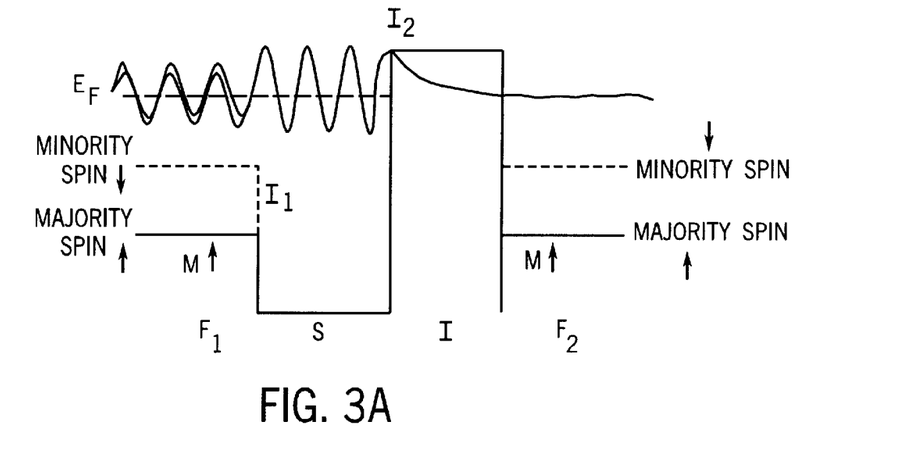
FIG. 3A is a representation of a one-dimensional quantum well model for a $F_1/S/I/F_2$ system for a ferromagnetic configuration and FIG. 3B is for an antiferromagnetic configuration.
Figure 3B:
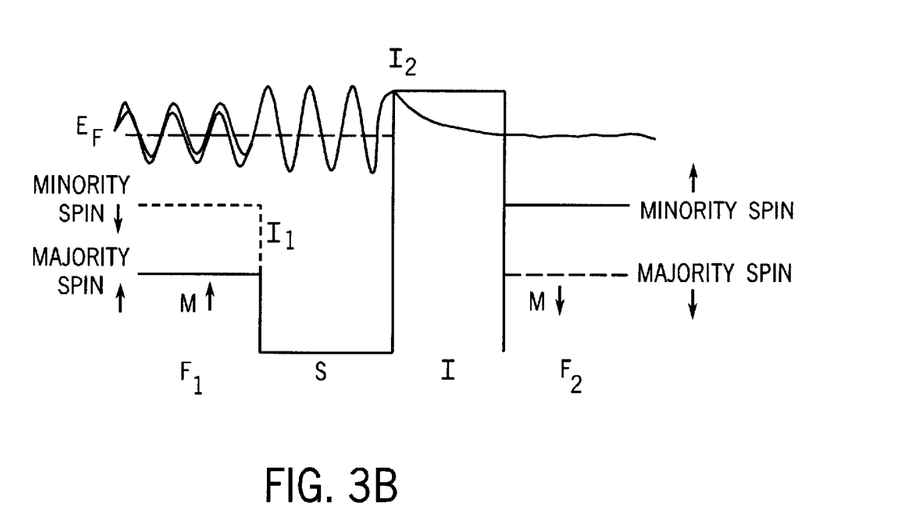

An insulating layer (I) is then inserted between the spacer layer (S) and the second ferromagnetic layer ($F_2$) as shown in FIGS. 3A and 3B. The spin up and down electrons in the spacer layer are reflected from the new interface ($I_2$) between the spacer and the insulator. Therefore, $\Delta R_2 \approx 0$ at interface 2, and no or an extremely small exchange coupling exists between the two ferromagnetic layers.

Figure 4A:
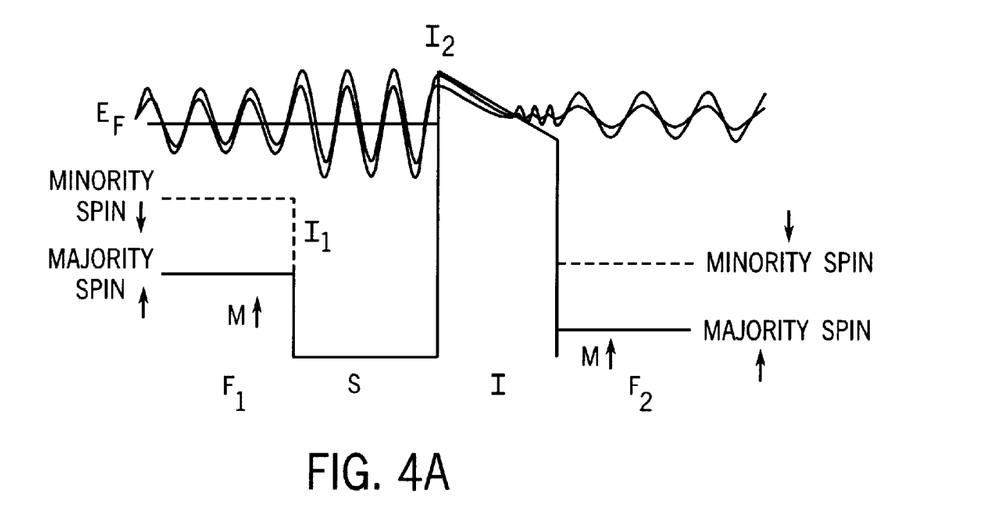
FIG. 4A is a representation of the well model of FIG. 3A and FIG. 4B for the corresponding FIG. 3B with a bias voltage applied in the $F_1/S/I/F_2$ system.
Figure 4B:
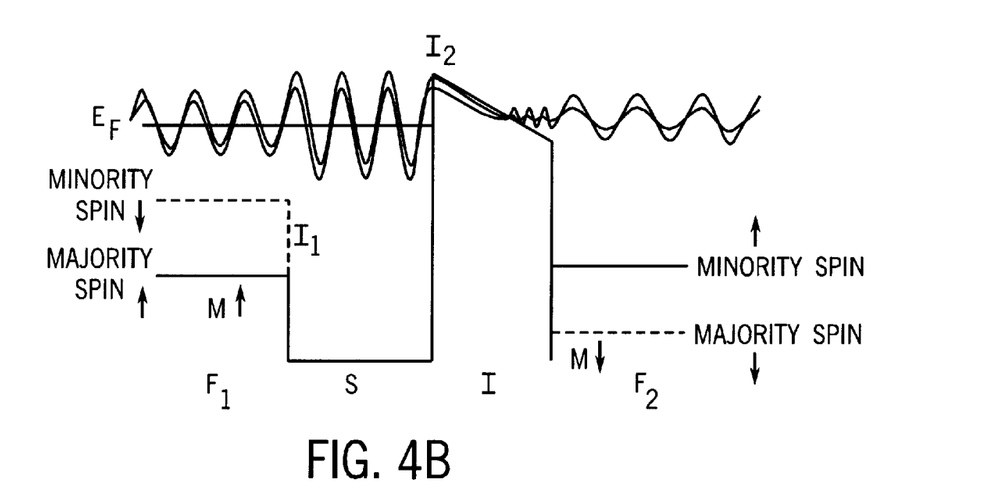

For the $F_1/S/I/F_2$ system, one can apply a bias voltage as shown in FIGS. 4A and 4B. With a bias voltage, the difference of reflectivities of spin up and down electrons at the interface 2 will not be zero; therefore, $\Delta R_2 \neq 0$ and this will also depend on the value of the applied voltage. Therefore, the interlayer exchange energy is also varied with the applied bias voltage.

Figure 5:
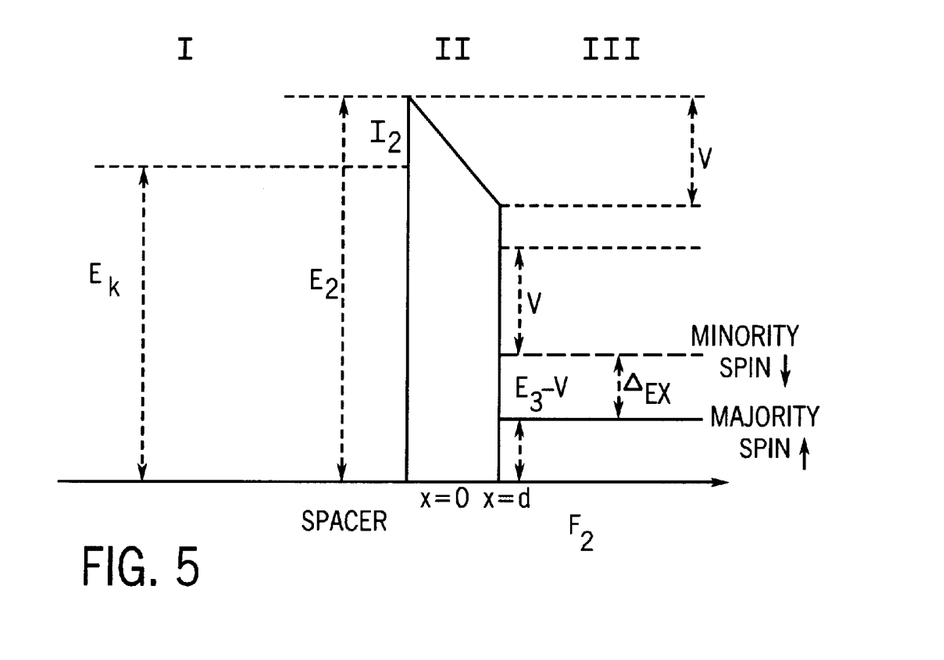
FIG. 5 is a schematic energy diagram for a trapezoidal potential barrier with applied bias voltage.

To see the results for the $F_1/S/I/F_2$ system with an applied bias voltage, a simple system is shown in FIG. 5. For the sake of the simplicity, reflectivity is only considered at interface 2 and the image force is neglected. The one dimensional Schrödinger equation for a potential barrier of trapezoidal shape can be solved analytically as follows:

$$\frac{\partial^2 \Phi(x)}{\partial x^2} - \frac{2m}{\hbar}[U(x) - E_K]\Phi(x) = 0 \quad (3)$$

$$\text{Here,} \quad U(x) = \begin{cases} 0 & \text{region I} \\ E_2 - Vx/d & \text{region II} \\ E_3 - V & \text{region III}. \end{cases}$$

For each region, the wave functions are:

region I: $A_1 \exp(ik_1 x) + B_1 \exp(-ik_1 x)$, region II: $A_2 Ai(Z(x)) + B_2 Bi(Z(x))$, region III: $A_3 \exp(ik_3 x)$.

Here, $Ai(Z)$ and $Bi(Z)$ are conventional Airy functions, $$Z(x) = \left(\frac{ad}{2V}\right)^{2/3}\left(E_2 - E_K - \frac{V}{d}x\right),$$

$$a = \frac{2\sqrt{2m}}{\hbar} = 1.025\frac{1}{\text{Å}\sqrt{eV}}, \text{ and}$$

$$k_1 = \frac{a}{2}\sqrt{E_K},$$

$$k_3 = \frac{a}{2}\sqrt{E_K - (E_3 - V)}.$$

From the above Schrödinger equation with continuity boundary conditions, the reflectivity of an incoming electron is determined by $$R_2 = \frac{\frac{(ik_1 L Ai(Z_0) + Ai'(Z_0))}{(ik_3 L Ai(Z_d) + Ai'(Z_d))} - \frac{(ik_1 L Bi(Z_0) + Bi'(Z_0))}{(ik_3 L Bi(Z_d) + Bi'(Z_d))}}{\frac{(ik_1 L Ai(Z_0) - Ai'(Z_0))}{(ik_3 L Ai(Z_d) + Ai'(Z_d))} - \frac{(ik_1 L Bi(Z_0) - Bi'(Z_0))}{(ik_3 L Bi(Z_d) + Bi'(Z_d))}}. \quad (4)$$

Where, $$\left(Ai'(Z_{0,d}) = \frac{dAi(Z_{0,d})}{dZ} = \frac{dAi(Z_{0,d})}{dx}\frac{dx}{dZ}\bigg|_{x=0,d}\right),$$

$$\left(Bi'(Z_{0,d}) = \frac{dBi(Z_{0,d})}{dZ} = \frac{dBi(Z_{0,d})}{dx}\frac{dx}{dZ}\bigg|_{x=0,d}\right)$$

$$\text{and } Z_0 = \left(\frac{ad}{2V}\right)^{2/3}(E_2 - E_K), Z_d = \left(\frac{ad}{2V}\right)^{2/3}(E_2 - E_K - V),$$

$$L = \left(\frac{4d}{a^2V}\right)^{1/3}.$$

As expected, the reflectivity depends on the energy state $E_3$ of the $F_2$ layer. Since the energies of spin up and down electrons at the ferromagnetic $F_2$ layer are different by the exchange split energy $\Delta_{EX}$, the reflectivities of spin up and down electrons are different, $\Delta R_2 \neq 0$. Thus, there is the possibility for an exchange coupling between the two ferromagnetic layers.

Figure 6:
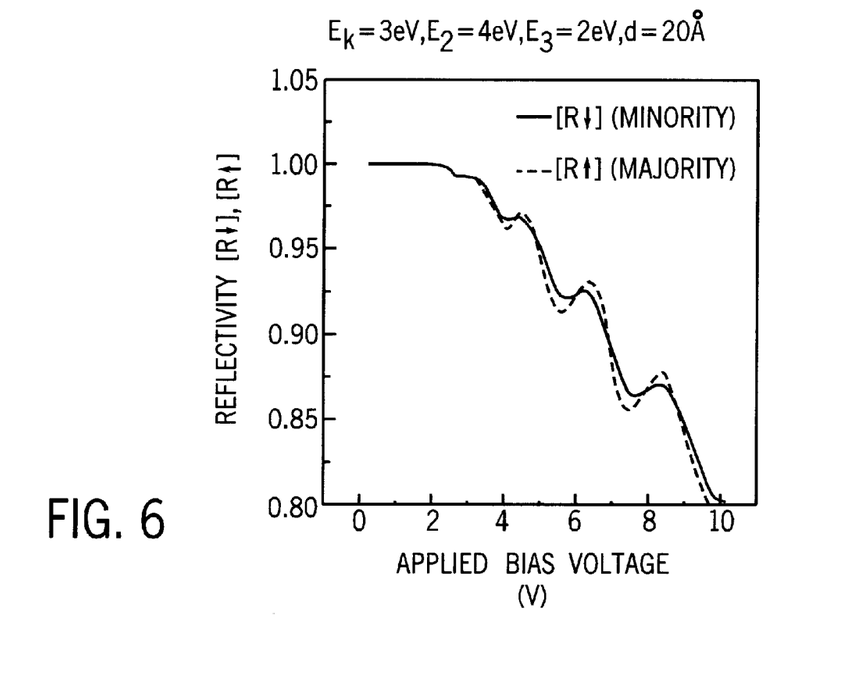
FIG. 6 is a plot showing the dependence of the reflectivities of spin up and down electrons on the applied voltage.

Using Eq. (4), the plots of the reflectivities for major($\uparrow$) and minor($\downarrow$) spins are depicted in FIG. 6 with $E_k=3$ eV, $E_2=4$ eV, $E_3=2$ eV, $\Delta_{EX}=1$ eV, and d=20 Å. The reflectivities oscillate with applied voltage. Since the $k_3\uparrow$ (for majority spin) is larger than $k_3\downarrow$ (for minority spin), the oscillation of the majority spin state is stronger than that of the minority spin state in the Eq. (4).

Figure 7:
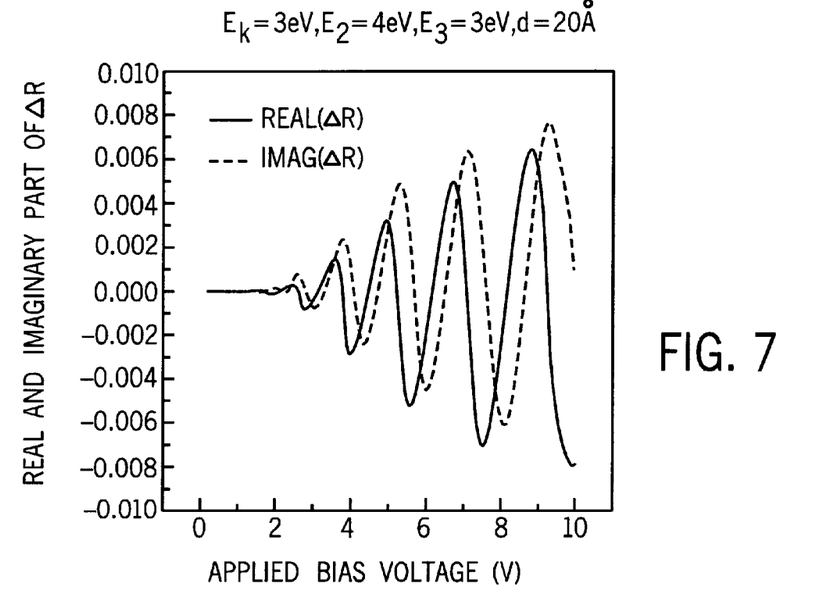
FIG. 7 is a plot of the real and imaginary parts of $\Delta R$ against the direct bias voltage.
Figure 8:
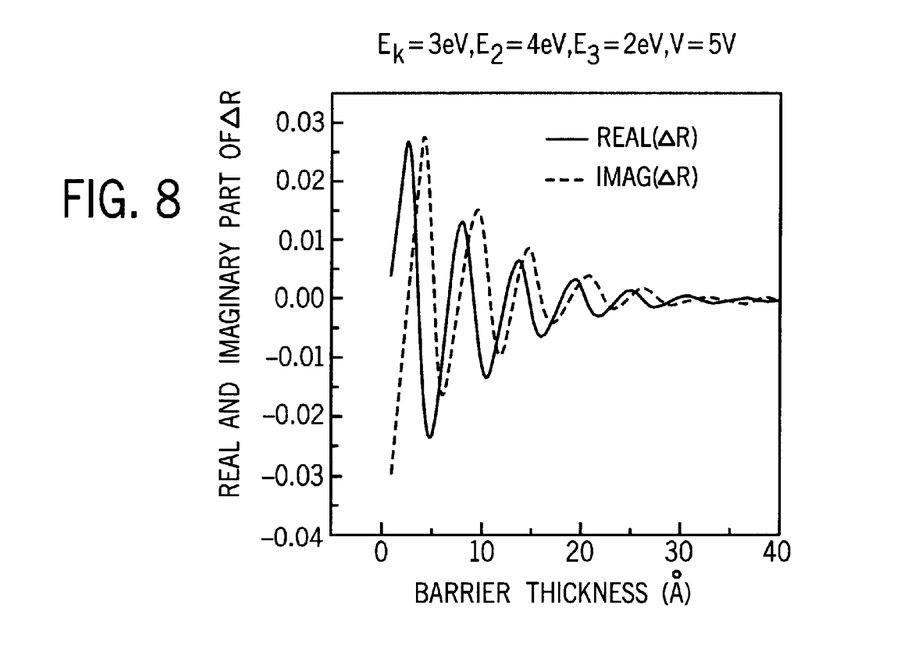
FIG. 8 is a plot showing the barrier thickness dependence of $\Delta R$ with different applied bias voltages.
Figure 9:
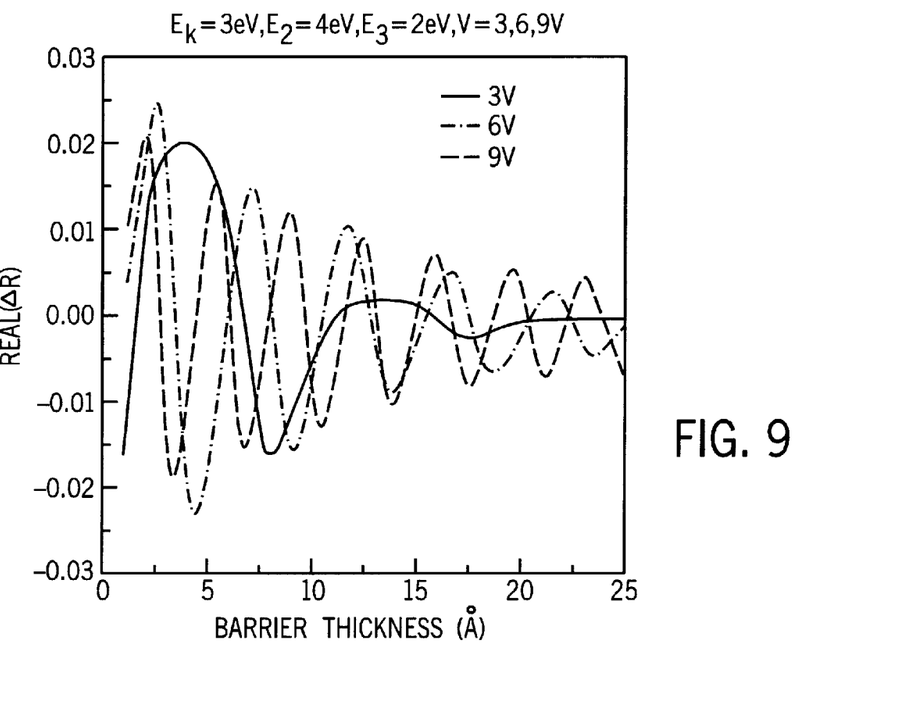
FIG. 9 is a plot showing the relationship between $\Delta R$ and barrier thickness with applied voltages of 3, 6, and 9 V.

With the same parameters, $\Delta R = R_\downarrow - R_\uparrow$ is shown in FIG. 7. The oscillation strength of $\Delta R$ increases with applied bias voltage. The barrier thickness dependence of $\Delta R$ for a fixed applied bias voltage is shown in FIG. 8. The oscillation strength decreases with increasing barrier thickness. From this figure, it is shown that if the barrier is rough, the oscillations should cancel out. The oscillation period depends not only on barrier thickness but also on applied bias voltage. $\Delta R$ vs. barrier thickness for different applied voltages is illustrated in FIG. 9. For larger applied bias voltage, the period decreases; therefore, to retain the effect a smooth barrier and small bias voltage are highly preferred.

For the sake of simplicity, the effect of the image force has been ignored in the above calculations, but the effect of the image force will be addressed later. To obtain a more physical understanding of the behavior of $\Delta R$, a first-order approximation of the exchange split energy $\Delta_{EX}$ is shown as follows:

$$\Delta R_2 = R_2^\downarrow - R_2^\uparrow \approx \frac{dR_2}{d\Delta_{EX}}\Delta_{EX}. \quad (5)$$

In combination with the properties of Airy functions, the above is reduced algebraically to:

$$\frac{\Delta R_2}{\Delta_{EX}} \approx \frac{a^2 k_1 L^2/(4k_3\pi^2)}{([(ik_3LAi(Z_d) + Ai'(Z_d))(ik_1LBi(Z_0) - Bi'(Z_0)) - (ik_1LAi(Z_0) - Ai'(Z_0))(ik_3LBi(Z_d) + Bi'(Z_d))])^2} \quad (6)$$

Figure 10:
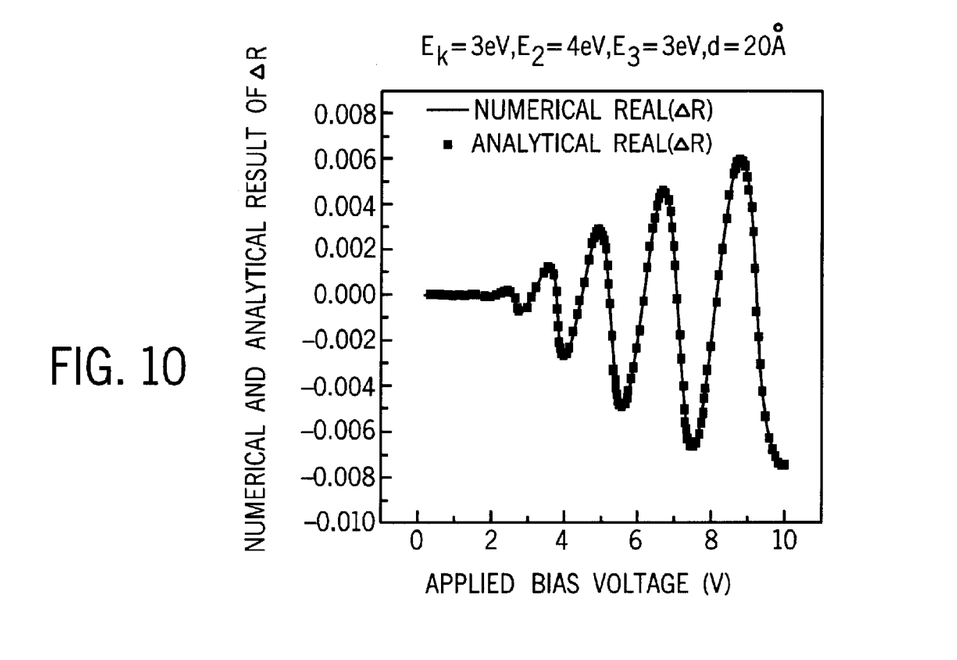
FIG. 10 is a plot showing the comparison of numerical calculations and the analytic calculation for $\Delta R$ vs. Applied Bias Voltage with $\Delta_{EX}=1$ eV.
Figure 11A:
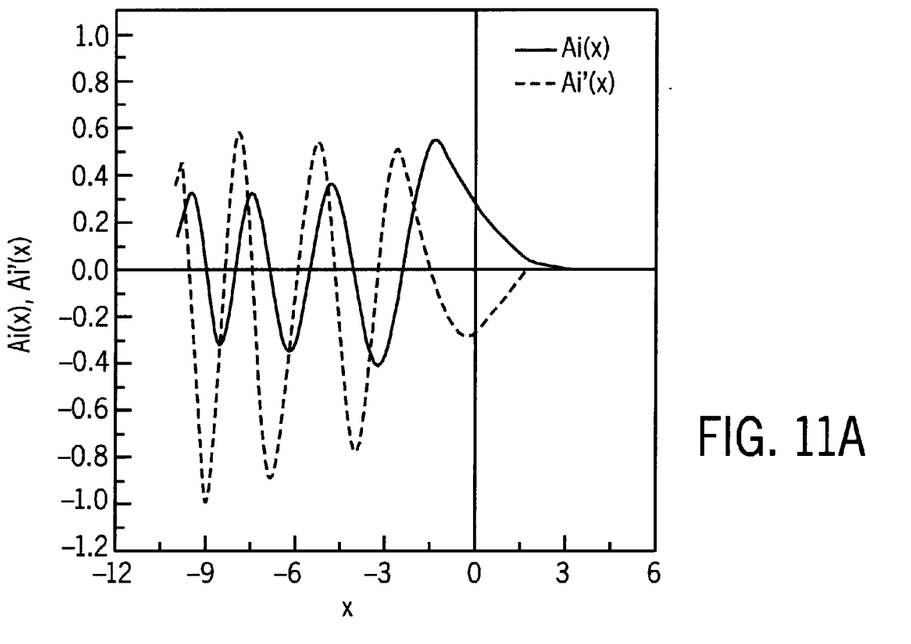
FIG. 11 are plots of Ai(x), Ai'(x), Bi(x), and Bi'(x) functions.
Figure 11B:
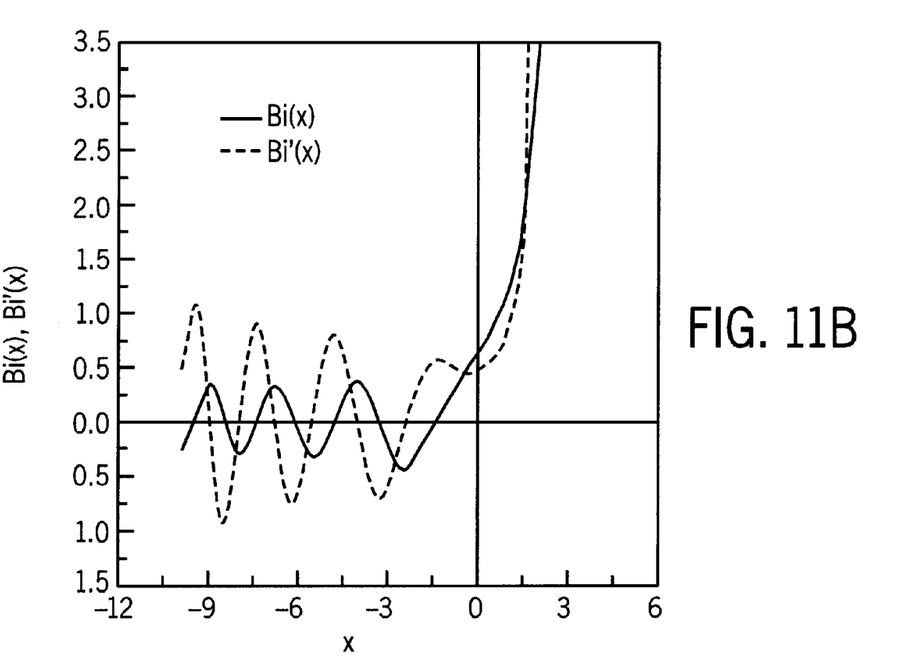

The numerical and analytic calculations with $\Delta_{EX}=1$ eV are shown to be good agreement in FIG. 10. To obtain a further understanding from Eq. (6), the properties of the conventional Airy functions are represented in FIG. 11. The Airy functions oscillate with negative argument, and then exponentially decrease or increase with positive argument. The oscillation period of $\Delta R_2$ is determined by only one argument, $Z_d$ or the Airy functions. $Z_d$ becomes negative, when $E_2-E_k-V<0$ and the Airy functions can be approximated by $$Ai(z) \approx \frac{\cos\frac{2}{3}|z|^{3/2} + \sin\frac{2}{3}|z|^{3/2}}{\sqrt{2\pi}|z|^{1/4}} \text{ when } z < -1 \quad (7)$$

$$Bi(z) \approx \frac{\cos\frac{2}{3}|z|^{3/2} - \sin\frac{2}{3}|z|^{3/2}}{\sqrt{2\pi}|z|^{1/4}} \text{ when } z < -1.$$

The derivatives of the Airy functions are also of similar form. Therefore, the oscillation period is given by:

$$\frac{2}{3}\left(\frac{ad}{2V}\right)|E_2 - E_K - V|^{3/2} = 2n\pi. \quad (8)$$

Thus, as can be seen from Eq. (8), the oscillation period of controllable exchange coupling is governed by the thickness of insulator layer, applied bias voltage, barrier height, and Fermi energy.

Figure 12:
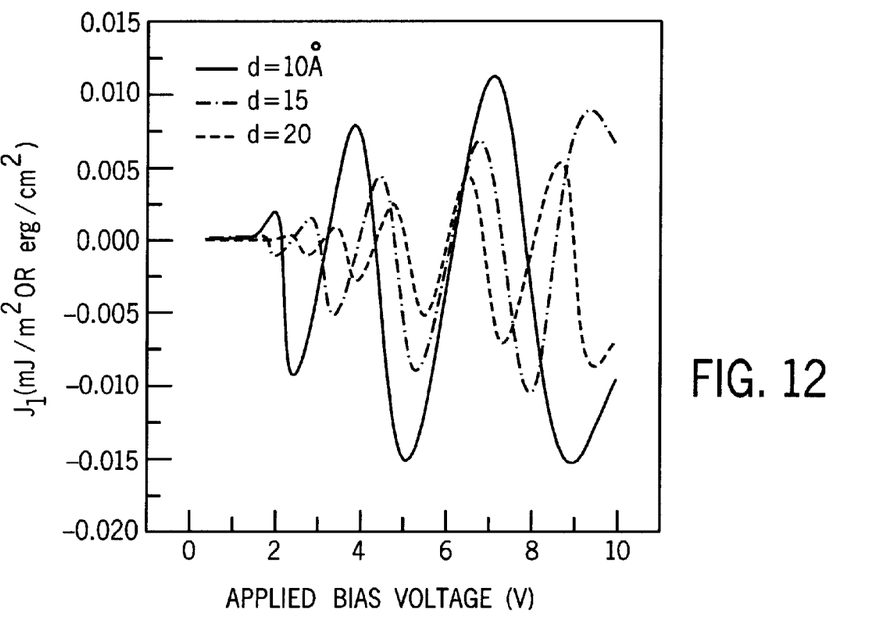
FIG. 12 is a plot of an interlayer exchange coupling, at T=0, with $E_f=3$ eV, $E_2=4$ eV, $E_3=2$ eV, $\Delta_{EX}=1$ eV, d=10, 15, and 20 Å.

The magnitude of the interlayer exchange energy $J_1$ for the free electron model can then be considered. The behavior of $J_1$ can be determined by conventional numerical integration. Since the exchange coupling energy in the insulator layer is very small for the given condition, the energy in the barrier region can be ignored. FIG. 12 shows the interlayer exchange coupling energy calculated for the barrier thicknesses d=10, 15, and 20 Å with parameters of $E_k=3$ eV, $E_2=4$ eV, $E_3=2$ eV, $\Delta_{EX}=1$ eV and spacer layer thickness D=10 Å. The order of magnitude of the maximum $|J_1|$ is $\sim 10^{-2}$ erg/cm². The corresponding effective magnetic field is given by $H \sim 4|J_1|/(M_s d_{Fe})$, $(M_s 1.7\times 10_3$ emu/cm³ for Fe, $d_{Fe} \sim 20$ Å) is $\sim 100$ Oe. For materials having smaller magnetization like rare-earth elements, the effective field will be increased. Therefore, for the d~10 Å case, an observable interlayer exchange coupling energy for the $F_1/S/I/F_2$ system should be measurable. For comparison, the coupling energy for the system $F_1/S/F_2$ without an insulator barrier is calculated to be $\sim 0.2$ erg/cm² at spacer thickness D=10 Å with all other parameters being the same. Therefore, the magnitude of the exchange coupling in the $F_1/S/I/F_2$ system is roughly an of magnitude or smaller than that of the $F_1/S/F_2$ system. In the free electron model, the dependence of the bias voltage on $J_1$ is very similar to $\Delta R_2$. The oscillation period and amplitude of $J_1$ is almost the same as for $\Delta R_2$.

Figure 13:
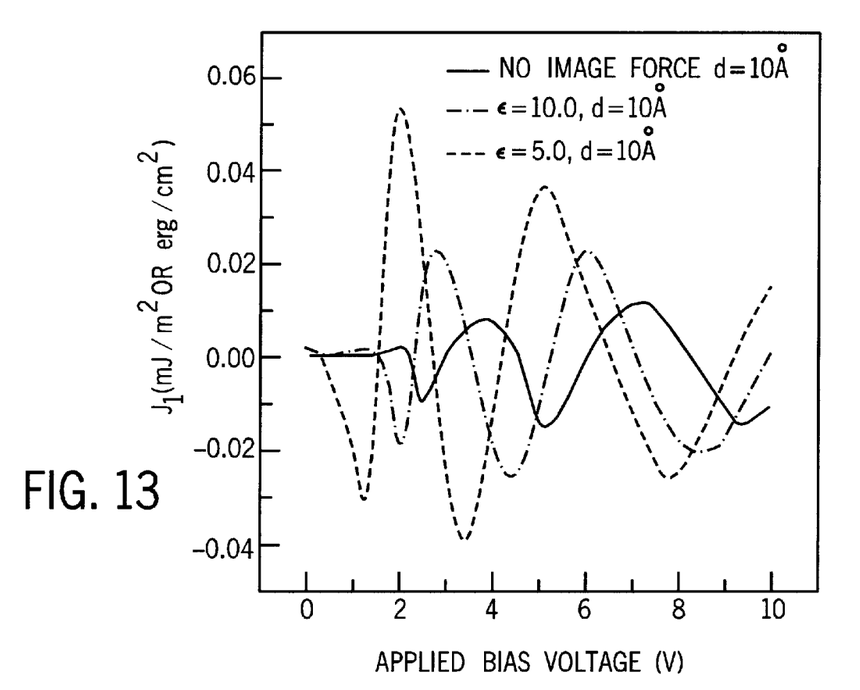
FIG. 13 is a plot of an interlayer exchange coupling, at T=0, with $E_k$=3 eV, $E_2$=4 eV, $E_3$=2 eV, $\Delta_{EX}$=1 eV, d=10 Å with image force correction.

The effect of the image force should also be considered at the location of the tunneling process across the insulator layer. It is known that the image force rounds off the trapezoidal potential barrier and decreases the effective barrier thickness and height. Furthermore, the effect of the image force causes a change in the solution of the above Schrödinger equation and also on the detailed dependence of $\Delta R_2$ and $J_1$ on the parameters. There is no presently available rigorous analytic solution for the image force. Since the effect of the image force in normal tunneling is usually negligible or a minor corrections, normally it is reasonable to neglect it. In this case, however, the effect of the image force can be very large. Consequently with image force correction, the Schrödinger equation can be solved numerically in a conventional manner. As expected, the image force enhances the spin dependent tunneling, and interlayer exchange coupling in the $F_1/S/I/F_2$ system. For a dielectric constant of insulator barrier ε=5 or 10 and no image force, the results are shown in FIG. 13. The interlayer exchange coupling with image force corrections is about 2~5 times enhanced above that without corrections of the image force. Therefore, the effective magnetic field increases to about 500 Oe for the Fe. With the image force, the oscillation period and the amplitude of $J_1$ are still similar to that of the $\Delta R_2$, but the behavior is different from that described by Eq. (6). To increase the effect of the image force, a tunneling barrier with small dielectric constant is favorable.

Figure 14:
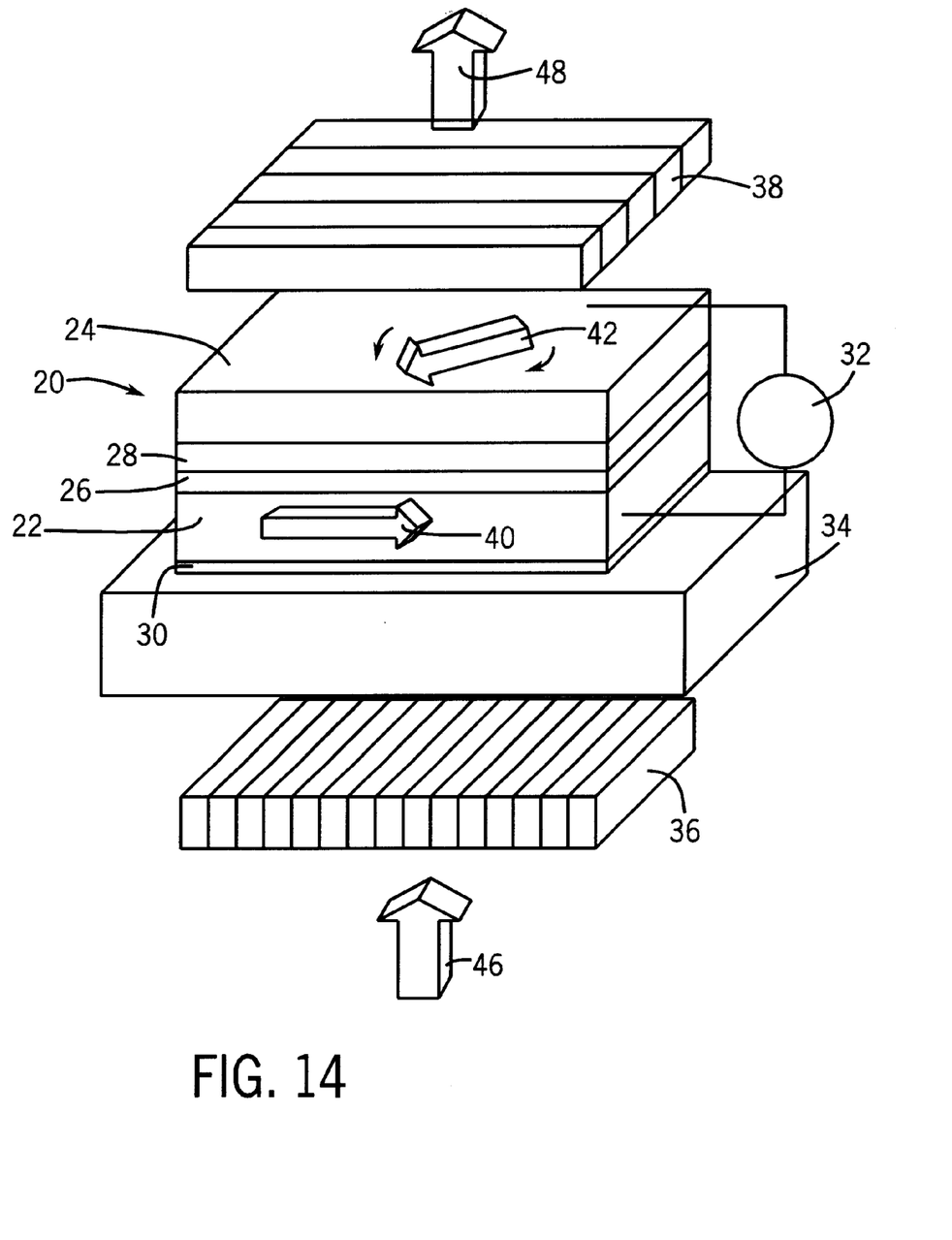
FIG. 14 is a schematic view of a multilayer ferromagnetic device in a display or optical switch application.

In accordance with one form of the invention shown in FIG. 14, a multilayer ferromagnetic device 20 comprises a first ferromagnetic layer 22 and a second ferromagnetic layer 24. In between the two ferromagnetic layers 22 and 24 are a spacer layer 26 and an insulating layer 28. Preferably, the spacer layer 26 is located between the first ferromagnetic layer 22 and the insulating layer 28.

A variety of materials can be used for the two ferromagnetic layers 22 and 24, the spacer layer 26, and the insulating layer 28. Iron or cobalt is preferably used for the first ferromagnetic layer 22 while iron, cobalt or permalloy is preferably used for the second ferromagnetic layer 24. In the preferred embodiment of the invention, either chromium or copper can be used for the spacer layer 26. For the insulating layer 28, many narrow band gap semiconductors can also be used. For example, materials such as $SI_3N_4$, $Al_2O_3$, $SiO_2$, magnesium oxide, silicon, or germanium are particularly useful to achieve the desired result. It should be noted, however, that there are many other materials with similar properties as those mentioned above which can also be used to achieve the functionality of the invention.

The ferromagnetic layers 22 and 24 can have a variety of thicknesses, while still achieving the desired result. Preferably, the first ferromagnetic layer 22 will have a thickness of between about 40 and 100 Å, while the second ferromagnetic layer 24 has a thickness of between about 10 and 50 Å. Both the spacer layer 26 and the insulating layer 28 preferably have a thickness of about 10 Å. It is possible, however, for the thicknesses of the ferromagnetic layers 22 and 24, in addition to the spacer layer 26 and the insulating layer 28, which can have a thickness as great as about 500 Å.

In regard to the ferromagnetic layers 22 and 24, one of the two ferromagnetic layers 22 and 24 will have softer magnetic properties than the other. In other words, the direction of magnetization of the "softer" ferromagnetic layer will be easier to alter than the direction of the "harder" layer.

Figure 1:
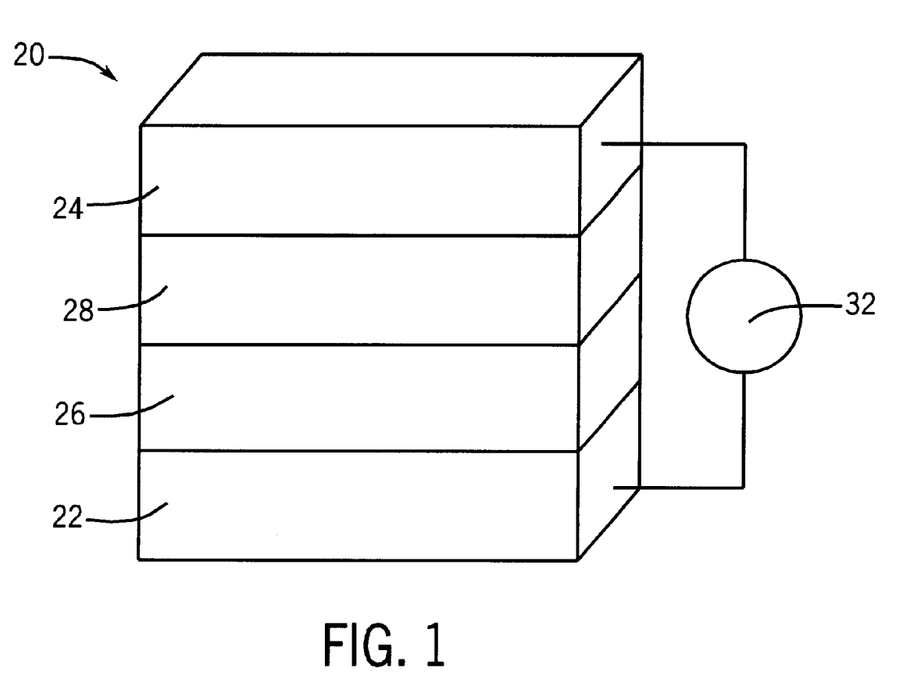
FIG. 1 is a schematic view of a multilayer ferromagnetic device.

As shown in FIGS. 1 and 14, a direct bias voltage 32 is applied across the two ferromagnetic layers 22 and 24. When the voltage 32 is applied to the device 20 the second ferromagnetic layer 24 will have its direction of magnetization oscillate depending upon the value of the external applied voltage 32. This will cause the interlayer exchange coupling to oscillate between anti-ferromagnetic and ferromagnetic as the value of the external voltage 32 increases. Importantly, this oscillation occurs in the absence of any external magnetic field.

The device 20 as shown in FIG. 14 can be used in applications such as a flat panel display, represented as item 70 in FIG. 14, or optical switch. In this embodiment, the device 20 is placed on a substrate 34. Preferably the substrate 34 is made from a material such as epitaxial magnesium oxide or silicon, although other materials can also be utilized. Additionally, a buffer layer 30 is located between the substrate 34 and the first ferromagnetic layer 22. The buffer layer 30 is preferably made from a material such as chromium or copper. A pair of polarizers 36 and 38 are placed on opposite sides of the device 20. Various amounts of light 46 will pass through the polarizers 36 and 38 depending upon the relative direction of magnetizations of the ferromagnetic layers 22 and 24. As discussed earlier, the direction of magnetization 40 of the first ferromagnetic layer 22 is considered the harder of the two layers in this instance, while the direction of magnetization 42 of the second ferromagnetic layer 24 is considered to be more easily rotated due to the softer properties of the second layer 24.

The operation of the device 20 is as follows: light 46 will enter the device 20 after is passes through the first polarizer 36, the transparent substrate 34 and buffer layer 30. At the same time a voltage 32 is applied across the interlayer exchange coupling comprising the two ferromagnetic layers 22 and 24. As the voltage 32 increases, the direction of the magnetization 42 of the second ferromagnetic layer 24 will rotate relative to the direction of magnetization 40 of the first ferromagnetic layer 22. Although in FIG. 14 it appears that the direction of magnetization 40 of the first ferromagnetic layer 22 is fixed, this is not a necessary condition for the successful operation of the device 20. The direction of magnetization 42 of the second ferromagnetic layer 24 plays a substantial role in the magnitude of the light intensity 48 that exits the second polarizer 38.

As earlier described, this type of arrangement can be very useful for devices, such as flat panel displays. As described above, the ferromagnetic device 20 would serve as an optical switching device for the display monitoring and regulating the intensity of light that is projected onto the display screen. Furthermore, the device 20 could operate as a magnetic field sensor in a computer hard drive, represented as item 80 in FIG. 14, wherein a digital read head is coupled to the device, and magnetic random access memories, and magnetic layer circuits for central processor units.

While preferred embodiments have been shown and described, it should be understood that changes and modifications can be made therein without departing from the invention in its broader aspects. For example, it is possible that other materials having similar properties to those already described in this specification could be used by those of ordinary skill in the art while not subtracting from the functionality of the invention. Various features of the invention are defined in the following claims.

What is claimed is:

1. A system for controlling a magnetization direction of materials, comprising:
   a ferromagnetic device, including:
      a first electrode comprising a first ferromagnetic layer;
      a second electrode comprising a second ferromagnetic layer disposed adjacent the first ferromagnetic layer such that an interlayer exchange coupling is formed between the first and second ferromagnetic layers;
      an insulating layer located between the first and second electrodes;
      a spacer layer located between the first electrode and the second electrode; and
      voltage bias means sufficient for changing the interlayer exchange coupling without assistance from an external magnetic field, such that when the bias means applies a bias voltage to the ferromagnetic layers, the interlayer exchange coupling is affected and the direction of magnetization of the second ferromagnetic layer is altered.

2. The system of claim 1, wherein the bias means alters the direction of magnetization of the second ferromagnetic layer in the absence of a magnetic field.

3. The system of claim 2, wherein the bias means operates with at least about 1.0 volts to alter the direction of magnetization of the second ferromagnetic layer.

4. The system of claim 3, wherein the bias means operates at between about 1.0 volts and 10.0 volts for altering the magnetization of the second ferromagnetic layer.

5. The system of claim 2, wherein the ferromagnetic layers have a thickness of between about 20 and about 500 angstroms.

6. The system of claim 2, wherein the spacer layer has a thickness between about 10 and about 500 angstroms.

7. The system of claim 6, wherein the spacer layer has a thickness of about 10 angstroms.

8. The system of claim 2, wherein the insulating layer has a thickness between about 10 and about 500 angstroms.

9. The system of claim 8, wherein the insulating layer has a thickness of about 10 angstroms.

10. The system of claim 1, wherein the spacer layer is located between the first electrode and the insulating layer.

11. The system of claim 2, wherein the second ferromagnetic layer possesses magnetic properties are softer than the first ferromagnetic layer.

12. The system of claim 2, wherein the insulating material comprises a material selected from the group consisting of $Si_3N_4$, $Al_2O_3$, Si, $SiO_2$, MgO, and Ge.

13. The system of claim 2, wherein the spacer comprises a material selected from the group consisting of chromium and copper.

14. The system of claim 2, wherein the first ferromagnetic layer comprises a material selected from the group consisting of iron and cobalt.

15. The system of claim 14, wherein the second ferromagnetic layer comprises a material selected from the group consisting of iron, cobalt, and permalloy.

16. The system of claim 2, wherein when the bias voltage applied to the device is increased, the magnetic configurations of the magnetic layers oscillate from antiferromagnetic to ferromagnetic.

17. The system of claim 2, further comprising a flat panel display coupled to the ferromagnetic device, wherein the ferromagnetic device serves as an optical switching device for the display.

18. The system of claim 2, further comprising a computer hard drive with a digital read head coupled to the ferromagnetic device, wherein the ferromagnetic device operates as a magnetic field sensor for the digital read head.

19. The system of claim 2, wherein the magnetization direction of one of the ferromagnetic layers is fixed in the presence of an increasing direct bias voltage.

20. In a system having controllable exchange coupled layers for altering a magnetization direction of a plurality of magnetic layers, including first and second ferromagnetic layers, an insulating material between the magnetic layers, and a spacer layer located between the first ferromagnetic layer and the insulating material, wherein an improvement comprises:

means for applying a bias voltage across the coupled layers sufficient to cause the magnetic configuration of at least one of the magnetic layers to oscillate between a ferromagnetic and antiferromagnetic configuration without assistance from an external magnetic field.

21. The improvement as described in claim 20, wherein the means for applying a bias voltage is applied absent means for generating an external magnetic field.

22. The process of claim 20, wherein the spacer layer comprises a material selected from the group consisting of chromium and copper.

23. A process of controlling the magnetization direction in a system with interlayer exchange coupling, comprising the steps of:

providing first and second electrodes comprising ferromagnetic materials to form an interlayer exchange coupling;

placing a spacer material between the first and second electrodes;

placing an insulator between the first and second electrodes; and generating a bias voltage across the interlayer exchange coupling sufficient to alter a magnetization direction of at least one of the ferromagnetic materials without assistance from an external magnetic field.

24. The process of claim 23, wherein the bias voltage is applied across the interlayer with exchange coupling in the absence of an external magnetic field.

25. The process of claim 24, wherein the bias voltage comprises a direct bias voltage of at least about 1.0 volts applied across the interlayer with exchange coupling.

26. The process of claim 25, wherein the bias voltage comprises a direct bias voltage of between about 1.0 and about 10.0 volts applied across the interlayer with exchange coupling.

27. The process of claim 23, wherein the spacer material comprises a material selected from the group consisting of chromium and copper.

* * * * *